(12) United States Patent
Zoran et al.

(10) Patent No.: US 10,005,312 B2
(45) Date of Patent: *Jun. 26, 2018

(54) METHODS AND APPARATUS FOR HANDHELD TOOL

(71) Applicant: Massachusetts Institute of Technology, Cambridge, MA (US)

(72) Inventors: Amit Zoran, Jerusalem (IL); Joseph Paradiso, Somerville, MA (US); Roy Shilkrot, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 189 days.

This patent is subject to a terminal disclaimer.

(21) Appl. No.: 15/130,973

(22) Filed: Apr. 16, 2016

(65) Prior Publication Data

US 2016/0231734 A1 Aug. 11, 2016

Related U.S. Application Data

(63) Continuation of application No. 13/784,674, filed on Mar. 4, 2013, now Pat. No. 9,342,632.

(Continued)

(51) Int. Cl.
*B44B 3/00* (2006.01)
*G06F 17/50* (2006.01)
*G05B 19/4099* (2006.01)

(52) U.S. Cl.
CPC .......... *B44B 3/009* (2013.01); *G05B 19/4099* (2013.01); *G06F 17/50* (2013.01);

(Continued)

(58) Field of Classification Search
None
See application file for complete search history.

(56) References Cited

U.S. PATENT DOCUMENTS 6,493,608 B1 12/2002 Niemeyer
8,396,595 B2 * 3/2013 Dariush ................ B25J 9/1666
700/255

(Continued)

OTHER PUBLICATIONS

Jaramaz, B., Brisson, G., Kanade, T., Digioia, A., 2004. Precision Freehand Sculpting of Bone, In Proceedings of the 7th International Conference on Medical Image Computing and Computer-Assisted Intervention, (MICCAI 2004), vol. II, pp. 105-112.

(Continued)

*Primary Examiner* — Jason Lin
(74) *Attorney, Agent, or Firm* — Stephen R. Otis

(57) ABSTRACT

In exemplary implementations of this invention, a computer-assisted, handheld machining tool allows even an inexperienced user to carve a complex 3D object, while maintaining artistic freedom to modify the sculpture from an initial CAD design. The tool prevents the user from unintentionally removing material from a volume defined by the CAD design. It does so by slowing or halting spindle rotation as the bit approaches or penetrates the protected volume. The user can override this protective feature. The tool may operate in at least three interaction modes: (i) a static mode in which a static CAD model is used, where the computer assists by preventing the user from damaging the static model; (ii) a dynamic mode where the computer dynamically modifies the CAD model during the sculpting process; and (iii) an autonomous mode where the computer can operate independently of the user, for tasks such as semi-automatic texture rendering.

20 Claims, 12 Drawing Sheets

Related U.S. Application Data

(60) Provisional application No. 61/605,941, filed on Mar. 2, 2012.

(52) U.S. Cl.
CPC ............. *G05B 2219/35134* (2013.01); *G05B 2219/49023* (2013.01); *Y02P 90/265* (2015.11); *Y02T 10/82* (2013.01)

(56) References Cited

U.S. PATENT DOCUMENTS

| | | |
|---|---|---|
| 8,755,864 B2 * | 6/2014 | Hauck .................. A61B 5/6885 600/424 |
| 9,259,195 B2 * | 2/2016 | Yanof ...................... A61B 6/12 |
| 2002/0036617 A1 | 3/2002 | Pryor |
| 2004/0046736 A1 | 3/2004 | Pryor et al. |
| 2005/0062738 A1 | 3/2005 | Handley et al. |
| 2009/0192620 A1 | 7/2009 | Ebbit |
| 2011/0172672 A1 | 7/2011 | Dubeau et al. |
| 2012/0143364 A1 | 6/2012 | Mcleod et al. |
| 2013/0137079 A1 | 5/2013 | Kahle et al. |

OTHER PUBLICATIONS

Lee, J.H., 2011, Haptic intelligentsia. http://web.archive.org/web/20111015000000*/http://studio-homunculus.com/portfolio/haptic-intelligentsia-human-prototyping-machine (Note: this is a copy of webpage crawled by the Wayback Machine on Nov. 17, 2011. This copy was obtained from the Wayback Machine website on Mar. 4, 2013).

* cited by examiner

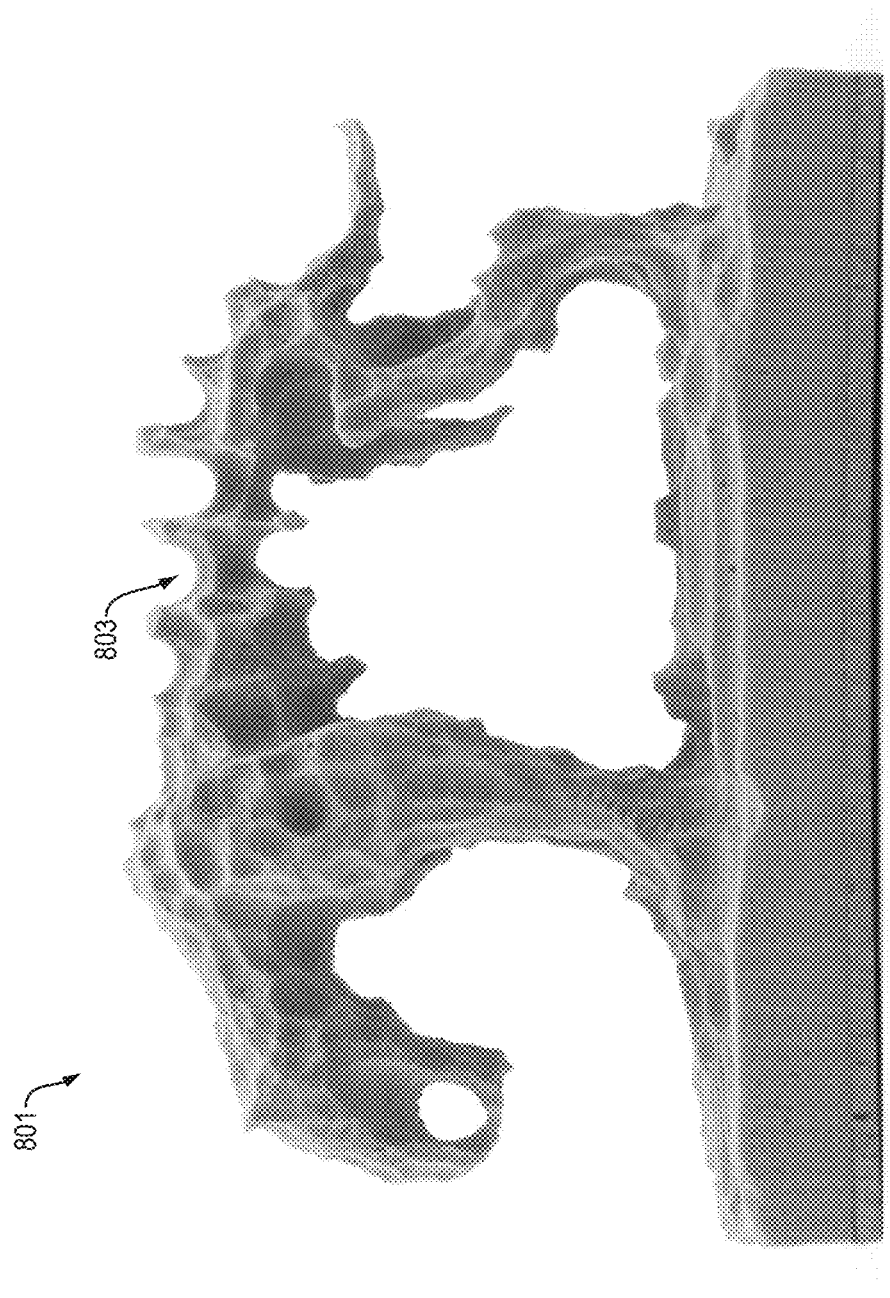

METHODS AND APPARATUS FOR HANDHELD TOOL

RELATED APPLICATIONS

This application is a continuation of U.S. application Ser. No. 13/784,674 filed Mar. 4, 2013, which claims the benefit of U.S. Provisional Application Ser. No. 61/605,941 filed Mar. 2, 2012.

FIELD OF THE TECHNOLOGY

The present invention relates generally to subtractive manufacturing and additive manufacturing.

SUMMARY

In exemplary implementations of this invention, a computer-assisted, handheld machining tool allows even an inexperienced user to carve complex 3D objects, while maintaining artistic freedom to modify the sculpture from an initial CAD design. The tool prevents the user from unintentionally removing material from a volume defined by a CAD model of the object being carved. If the user tries to move the bit of the tool into that protected volume, the rotational speed of the bit slows as the bit approaches a surface of that volume, and halts completely if the bit penetrates a surface of that volume.

However, the user can intentionally this protective feature and remove material even from the protected volume. If the user provides input to override the protective feature, then the rotation of the bit does not slow or stop as the bit approaches and penetrates the volume defined by the CAD model.

The handheld machining tool may operate in at least three interaction modes: (i) a static mode in which a static CAD model is used, where the computer assists by preventing the user from damaging the static model; (ii) a dynamic mode where the computer dynamically modifies the CAD model during the sculpting process; and (iii) an autonomous mode where the computer can operate independently of the user, for tasks such as semi-automatic texture rendering.

In the static mode, the CAD model does not change. However, the user retains artistic freedom in any mode of operation of the tool, including the static mode. For example, the user can choose how closely and smoothly the resulting sculpture adheres to the surface of the protected volume, even while the bit remains outside that surface. Or, for example, the user can select features from multiple CAD models to create a hybrid shape that exists only in the resulting physical sculpture, not in any CAD model.

In the dynamic mode, artistic freedom is further enhanced. The computer modifies the CAD model in response to movements of the tool relative to the object being sculpted and to other user input, so that the user can cause the CAD model to change during the sculpting process.

The user may interact with the handheld tool in at least three different ways during dynamic mode operation: (i) direct shape deformation (DDS); (ii) volume occupancy optimization (VOO), and (iii) data-driven shape exploration (DDSE). In all three of these cases (DDS, VOO, and DDSE), if the user moves the bit into the volume defined by the virtual mode, the computer responds by dynamically modifying the CAD model. In each case, as the user removes material from the protected volume, the CAD model changes. The user can provide input indicating a selection of the type of dynamic mode operation. Alternately, the tool may have only one type of dynamic mode operation.

In direct shape deformation (DDS), the computer deforms the mesh of the CAD model in response to the bit penetrating the volume defined by that model. For example, if the bit penetrates the neck of a virtual giraffe model from the left, the computer can smoothly deform the mesh, so that the neck of the virtual giraffe model bends to the right.

In VOO, the computer optimizes the CAD model to best fit the remaining material of the object being sculpted.

In DDSE, the computer searches a database of many different CAD models, in order to select a CAD model that best fits the remaining material of the object being sculpted. The computer then employs volume occupancy optimization to fine-tune the CAD model to fit the remaining material.

In autonomous mode, the tool can operate independently of the user for small scale movements, for example to create rough or smooth surfaces.

Thus, the handheld rotary carving tool allows the user personalize and modify an underlying 3D model while fabricating the 3D object.

The description of the present invention in the Summary and Abstract sections hereof is just a summary. It is intended only to give a general introduction to some illustrative implementations of this invention. It does not describe all of the details of this invention. This invention may be implemented in many other ways.

BRIEF DESCRIPTION OF THE DRAWINGS

In FIG. 3A, the movement is lateral. In FIG. 3B, the movement is up and down in a carving plane.

FIG. 8 is a photograph of a sculpture, produced by a human user overriding an original CAD model of a tiger.

FIG. 9A shows a sculpture produced in accordance with the original CAD model, without a user override. FIG. 9B shows model deformation from the left. FIG. 9C shows model deformation from multiple directions.

Figure 1:
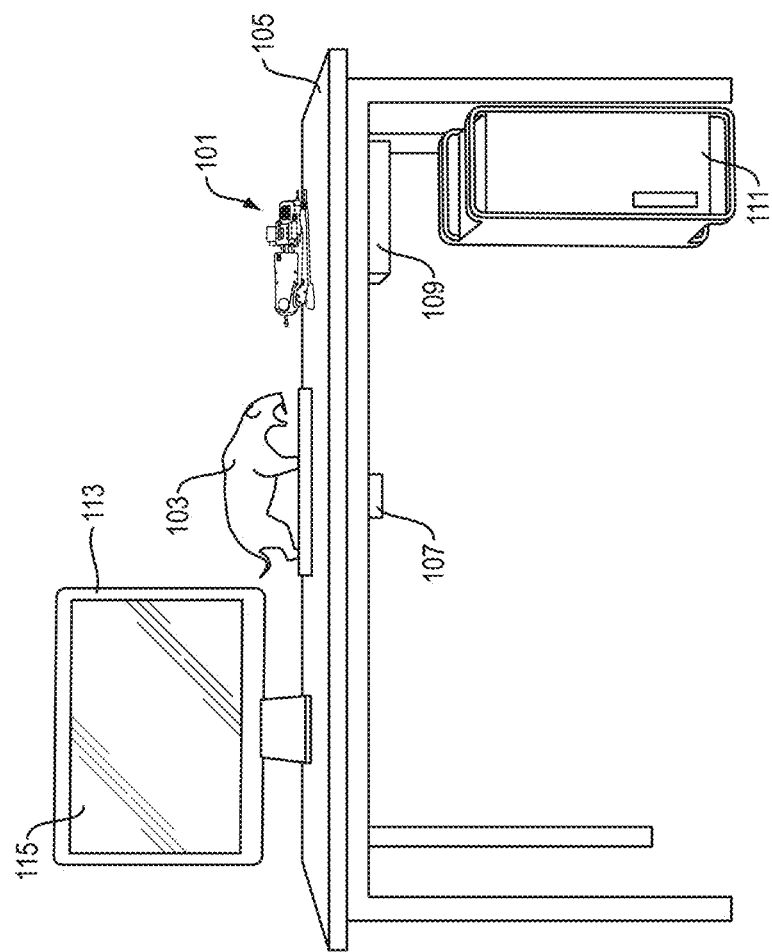
FIG. 1 shows a fabrication system including, among other things, a handheld machining tool, a computer, a monitor, and a magnetic motion tracking system.

The above Figures illustrate some illustrative implementations of this invention, or provide information that relates to those implementations. However, this invention may be implemented in many other ways. The above Figures do not show all of the details of this invention.

DETAILED DESCRIPTION

In exemplary implementations of this invention, a computer-assisted handheld machining tool is tracked and controlled with reference to a CAD model. The tool allows unskilled makers to produce complex carving tasks, and to personalize and modify digital 3D models while physically carving. The control software offers guidance according to static CAD models or dynamic ones, which may be altered directly or parametrically. In addition, the machining tool is also able to semi-autonomously move and carve. The machining tool is configured to allow a human artisan (a) to violate the virtual guidelines, and (b) to impart personal interpretations into the sculpture. This creates synergetic cooperation between human and machine that ensures accuracy in recreation of the model while preserving the expressiveness of manual carving.

For example, in a prototype of this invention, the tool can be used to carve a sculpture of an alien humanoid from balsa foam, relying on a computational 3D model. The human user can make decisions during the machining process, resulting in a unique, personalized sculpture. Or, for example, this prototype can be used even by a person with no prior sculpting training to carve a gargoyle sculpture with a wingspan of 280 mm based on a CAD model.

In this prototype, a handheld machining tool is monitored by a computer and a magnetic tracker, while a user freely moves the machining tool. Sensors and a computer track the location of the bit in relation to a CAD model, using this information to control the speed and alignment of the shaft. The user can choose to ignore the computer, thus transforming the tool from a computational-aided device to a purely manual one. Sensors allow the handheld machining tool to also serve as an input device. For example, data indicative of the position of the bit may be gathered by the sensors. This data may be used by the computer to, among other things: (i) determine how to react to user's actions, or (ii) guide semi-autonomous machining by the tool (e.g., in which the tool makes small-scale carving motions independently of the user).

In exemplary implementations, the handheld machining tool has at least three operational modes: (i) a static mode (in which the CAD model is rigid), (ii) a dynamic mode (in which a computational CAD model responds to physical movement of the machining tool relative to the object being carved and to other user actions), and (ii) a semi-autonomous mode of tool operation.

This invention may be implemented as a computer-assisted sculpting system comprises a handheld machining tool, a magnetic motion tracking system (MMTS), a control computer, and software distributed over the computer and the tool. The machining tool is held with a single hand, while the user is free to move it in 3D, limited only by the length of power cables and the MMTS.

FIG. 1 shows an example of such a system. A handheld machining tool 101 can be held by a user in one hand, in order to carve an object 103. The object being sculpted 103 may rest on a table 105 or pedestal. The MMTS may be used for tracking position of the handheld machining tool relative to the object being sculpted. The MMTS may comprise: (i) a magnetic field generator 107 located in a fixed position relative to (and close to) the object being sculpted, (ii) a magnetic sensor 207 located on the machining tool 101 and (iii) and a processor 109 configured to control the MMTS.

A computer 111 may be used to control the system, including controlling a graphical user interface displayed on an electronic display screen 115 (e.g., a computer monitor or other computer screen).

In the example shown in FIG. 1, the system integrates tracking capabilities, digital drivers for the DC and servo motors, and an option for the user to override a CAD model. Preferably, motors for the machining tool are located as far as possible from the MMTS sensor on the machining tool, in order to minimize the potential for magnetic noises.

In a prototype of this invention, the handheld tool includes a rotary cutting mechanism (including a spindle) built on top of a long shaft and connected to a 12V DC motor (Micro-Drives® M2232U12VCS with up to 10,000 RPM with no load, and up to 5.2 mNm torque). The 6.35 mm round bit is made from steel. A 3D bearing mechanism is located in the interior of the tool, adjacent to the titanium shaft. The bearing enables 3 degrees of freedom (DOF) movement at an approximate spherical volume of 20 mm.

In this prototype, three servomotors in the handheld tool determine the shaft's position. These servos are aligned perpendicular to the shaft and near the spindle motor.

In this prototype, the three servos comprise MKS 6125 mini servos which are strong (up to 5.8 kg-cm for 6V), small, and lightweight (25.26 g). An electronic circuit on the PCB (printed circuit board) of the handheld machining tool communicates with the main computer 111 via Bluetooth to control both the shaft movement and the spindle speed. The PCB includes an ATmega328 microprocessor and a MC33926 motor driver, and is powered with 5V and 12V power signals.

In this prototype, a force-sensing resistor (FSR) pressure sensor is located on the handle of the handheld machining tool. One or more processors output control signals to cause the DC motor speed (Sp, when 1 is the maximal value) to be a linear factor of the pressure (Pr, when 1 is maximal value) and the risk to the model (Rs, 1 is maximal risk):

$$Sp = 1 - Rs(1 - Pr) \qquad \text{(Eq. 1)}$$

In this prototype, two LEDs are located on the tool, to provide the user with visual feedback. The first LED blinks with correlation to the pressure detected by the FSR sensor (constant light represents maximal pressure, and no light represent no pressure). The frequency of the second LED corresponds to the distance between the bit and the surface of the model (when the bit touches the model's surface the light is constant). In addition, the operation frequency of the DC motor (PWM), controlled by the motor-driver, is changing from ultrasonic to an audible range (around 2 KHz) to give the user an alarm when the bit is approaching 4 mm of the model's surface.

Figure 2A:
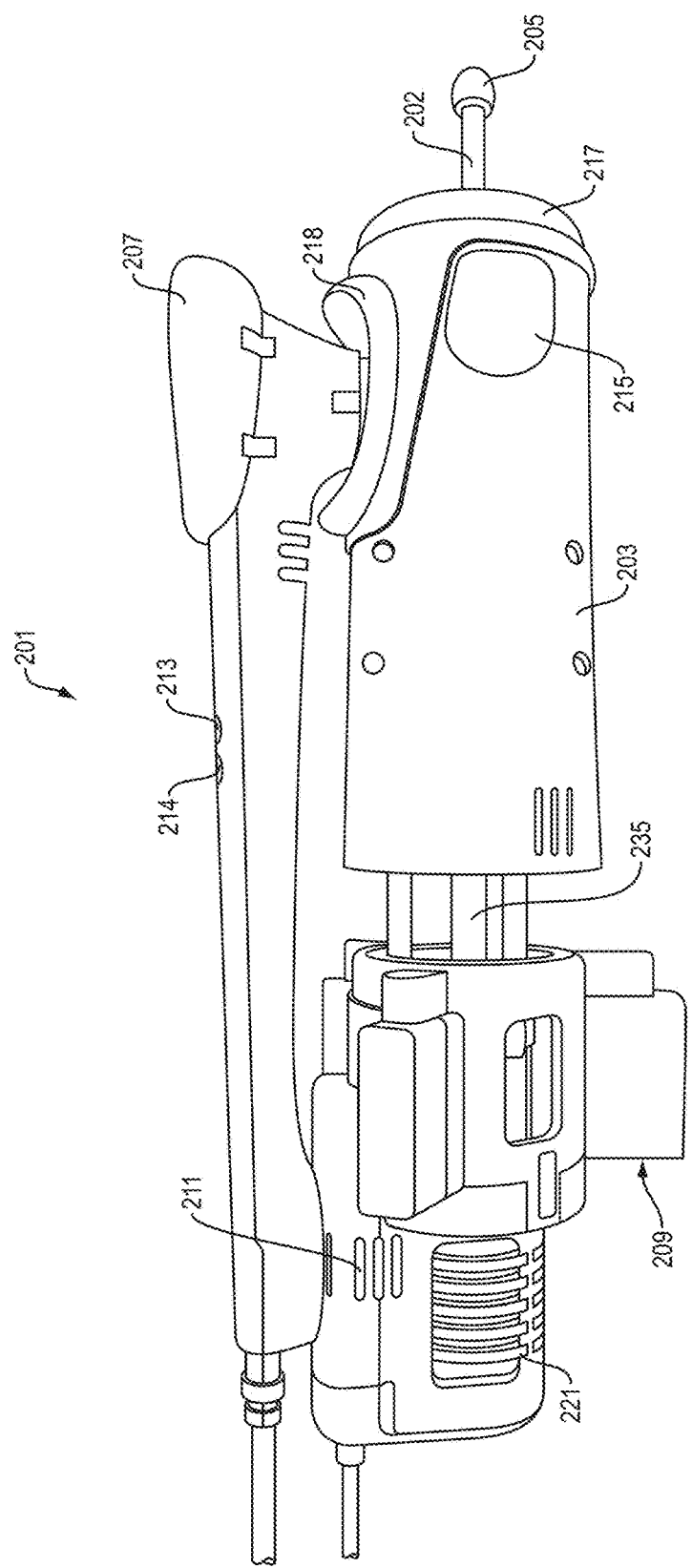
FIG. 2A is a side view of a handheld machining tool.
Figure 2B:
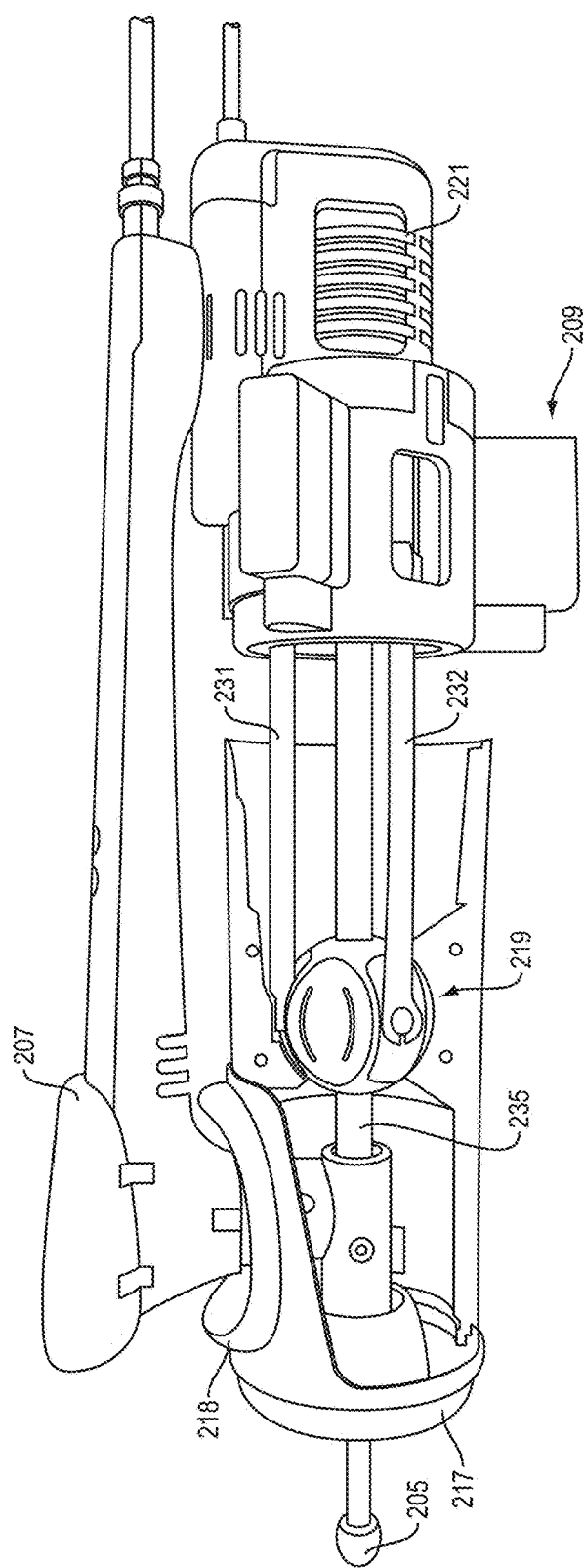
FIG. 2B is a cutaway view of the handheld machining tool, showing some internal parts of the tool.

FIG. 2A is a side view of a handheld computer-aided machining tool 201, in a prototype of this invention. FIG. 2B is a cutaway view of the same handheld machining tool 201, showing some internal parts of the tool.

As shown in FIGS. 2A and 2B, a rotary bit 205 is powered, via a spindle 202, by a DC electric motor 221. Three servo motors 209 control the position of the titanium shaft 235 relative to the handle 203 (and thus the position of the spindle 202 relative to the handle 203). An MMTS magnetic sensor 207 is used to track the position of the handheld machining tool 201 relative to the object being sculpted. A force-sensing pressure sensor 215 (FSR) mounted in the handle 203 can detect force applied when the machining tool 201 is pressed against the object being sculpted. Two LEDs 213, 214 provide visual feedback to the user regarding, respectively: (i) pressure detected by the FSR sensor and (ii) the distance between the bit 205 and the object being sculpted. Two flexible components 217, 218 are configured to allow the handle 203 to move relative to the shaft 235 with at least three degrees of freedom. In this prototype, the flexible components 217, 218 are dust filters. A PCB 221 housed in the machining tool 201 communicates with the external main computer and, together with the main computer, controls both shaft movement and spindle speed. Multiple-axis linear/spherical plain bearings 219 allow the shaft 203 to move relative to the handle 203. Rods (e.g., 231, 232) actuated by the three servo motors 209 are employed to control the position of the shaft 235 relative to the handle 203.

Figure 3A:
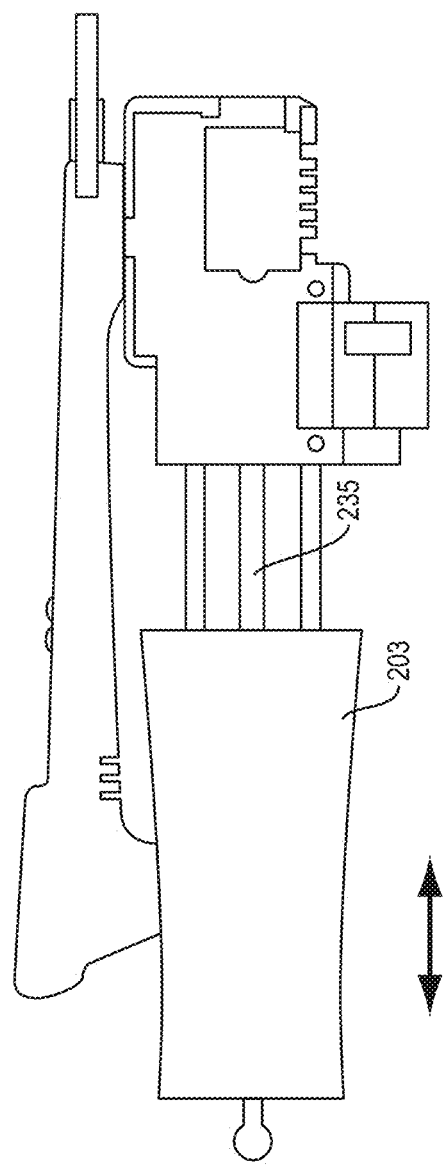
FIGS. 3A and 3B show examples of how the handle of the handheld machining tool can move relative to the spindle of the tool.
Figure 3B:
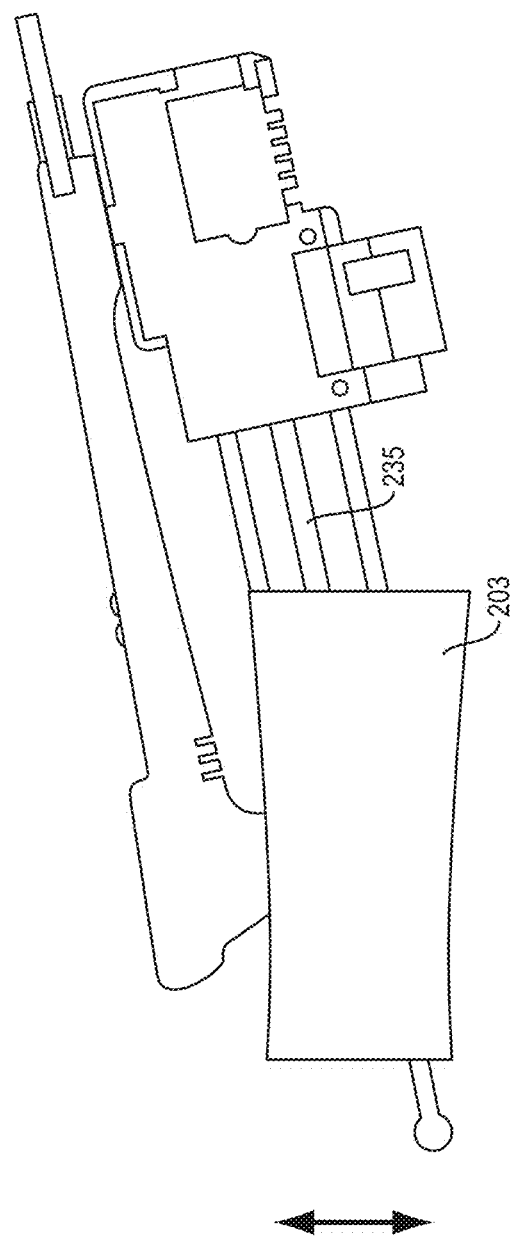

FIGS. 3A and 3B show examples of how the multiple-axis bearing 219 allows the handle 203 of the handheld machining tool to move in 3 degrees of freedom relative to the rest of the tool, including the shaft 235. In FIG. 3A, the movement is lateral. In FIG. 3B, the movement is up and down in a carving plane.

In a prototype of this invention, a major part of the computation is done on a PC (personal computer). An Alienware® M14x Laptop (i7-3740QM Intel® core, 12 GB DDR3, and 2 GB NVIDIA GeForce GT 650M graphic card are employed. A screen (e.g., 115) provides the user with visual feedback. An MMTS is used for tracking, because it has no drift and does not require an optical line-of-sight. In this prototype, the MMTS comprises a Polhemus FASTRAK® system, which is an AC six DOF system that has low latency (4 ms), high static accuracy (position 0.76 mm/orientation 0.15° RMS), and high refresh rate (120 Hz).

In this prototype, the CAD model resides on the computer. The computer executes software that runs in Grasshopper (a plug-in for Rhino). The input to the software is the 6D location and orientation of the tool (via serial communication), and the outputs are commands to the control PCB on the handheld machining tool. The communication with the PCB is one-sided synchronic, using virtual serial communication over Bluetooth.

A prediction of the next position of the bit is extrapolated by a spline of the 4th order (using the current location and the 3 previous ones). The software calculates the distances D to the CAD model (using rhinoscript MeshCP) from both the current location and the predicted one, and estimates which of these points put the model at higher risk (i.e., which is closer to the model). While the spindle's speed is calculated on the tool as a factor of Pr and Rs, the latter is calculated by the main control software (values in mm):

$$Rs = \begin{cases} 0 & \text{if } D <= 100 \text{ and } D > 4; \\ D/8 & \text{if } D <= 4 \text{ and } D > 0; \\ 1 & \text{elsewhere.} \end{cases} \quad (\text{Eq. 2})$$

For example, in a prototype of this invention, the handheld machining tool is configured to prevent the user from unintentionally overriding the CAD model, as follows: (a) if the distance between the highest risk position of the bit and the model is more than 4 mm, the computer calculates the risk Rs as zero, and does not slow the spindle rotational speed Sp; (b) if the distance D between the highest risk position and the model is greater than 0 mm and less than or equal to 4 mm, the computer computes the risk Rs as D/8, and thus slows the spindle rotational speed Sp; and (c) if the highest risk position is within the model, the computer calculates the risk Rs as 1 and stops the spindle rotation. See Equations 1 and 2. However, if the user has provided input that indicates the user's intent to deliberately override the CAD model, then the computer will not protect the 3D model by slowing the spindle in this way.

Equation 2 may be varied, depending on desired characteristics of the machining tool. For example, in some implementations, the spindle will not rotate if the distance between bit and sculpted object exceeds a certain value (e.g., 10 mm).

Figure 4:
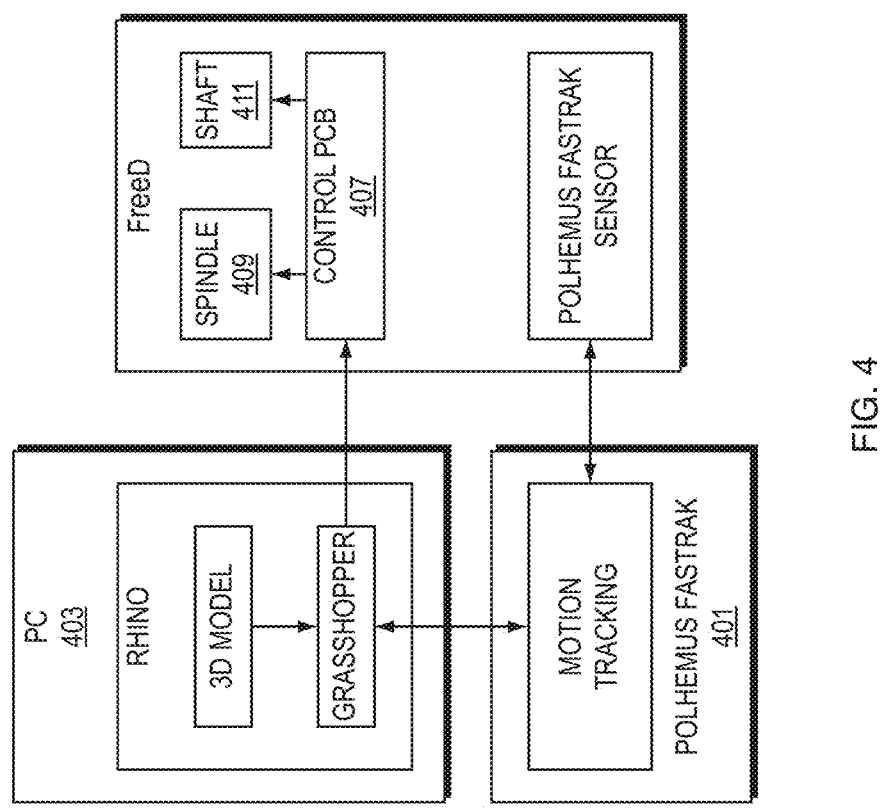
FIG. 4 is a high level diagram showing data flow in software for the handheld machining tool.

FIG. 4 is a high level diagram showing data flow, in a prototype of this invention. The MMTS 401 feeds the PC 403 with positioning information. The PC communicates with a control PCB 407, which sends control signals to the spindle 409 and shaft 411.

Figure 5:
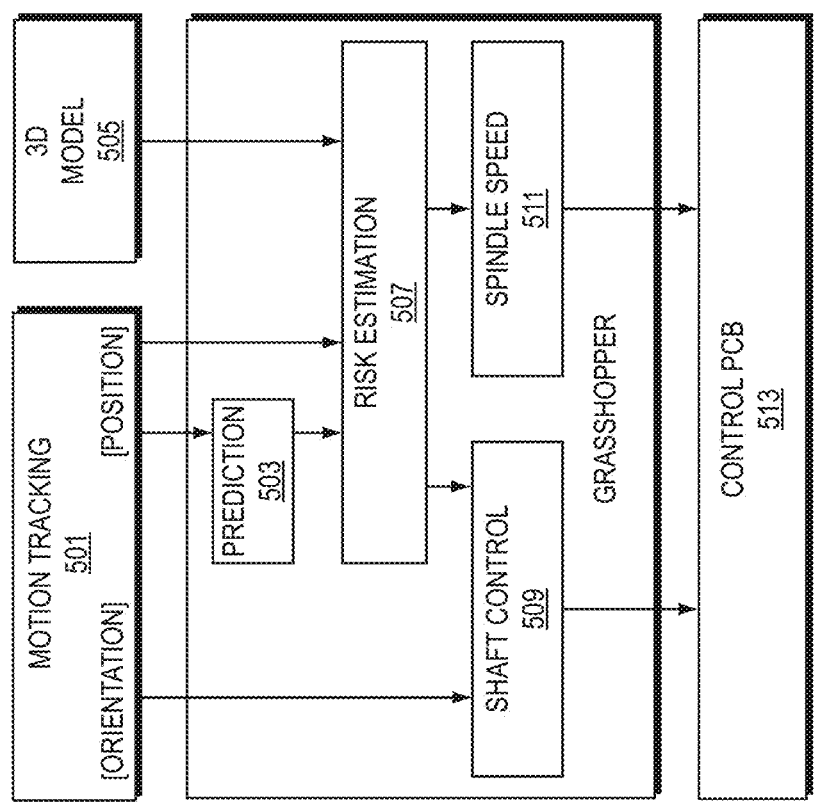
FIG. 5 is a high level diagram of control software for the tool.

FIG. 5 is a high level diagram of control software, in this prototype. The control software is implemented with a Grasshopper plug-in to Rhino3D. The computer receives signals from the motion tracking system 501 indicative of orientation and position of the handheld machining tool, and predicts 503 the next position of the bit. Based on this predicted next position and the CAD model 505, the computer calculates a risk factor 507 to the model, and outputs control signals for controlling spindle speed 511. The computer also outputs signals for controlling the position of the shaft 509. The shaft control signals 509 and spindle rotation speed control signals 511 are sent to the control PCB 513 on the machining tool. The computer also communicates with a graphical-user interface (GUI) displayed on a screen.

In this prototype, shaft control signals 509 are used to control the position of the shaft during semi-autonomous machining.

Alternately or in addition, the shaft control signals may be used to control shaft retraction for purposes of preventing the bit from entering the volume of the 3D model. In this alternate or additional approach, the computer prevents the bit from entering the volume of the 3D model, causing the servo motors to draw the shaft back as much as possible. When the bit moves farther from the surface, the software pushes the shaft back to its original position.

In exemplary implementations of this invention, shaft control takes into consideration the tool's attack angle ($\alpha$—the angle between the shaft and the normal to the model's surface in the closest point). The default shaft position is fully "open" ahead, with a potential to move 20 mm (in a direction normal to the surface of the 3D model) to absorb the offset and retract the shaft.

In a prototype implementation of this invention, the user operates the handheld machining tool while sitting adjacent to the material to be sculpted (e.g., balsa foam), which is attached to a wooden stand. The user is free to investigate any machining approach, such as extruding lines, drilling holes, trimming surfaces, or using an arbitrary pattern. The computer slows down the spindle as the bit approaches the model, stopping it completely when it would penetrate the CAD model. This enables the user to cut along the boundary of the CAD model where desired. The user can also leave parts of the model unfinished or override the computer using the pressure sensor. Further, in some modes of operation, the system can dynamically alter the model based on user actions or operate autonomously.

This prototype may operate in at least three interaction modes: (i) a static mode in which a static CAD model is used, where the computer assists by preventing the user from damaging the model; (ii) a dynamic mode where the computer numerically controls the CAD model, responding to the user's actions, so that the model dynamically changes during fabrication; and (iii) an autonomous mode where the computer can operate independently of the user, for tasks such as semi-automatic texture rendering.

Static Mode:

In the static mode, the user interaction with the tool does not contribute to the CAD model, and the boundary of the virtual object remains static during the process. The user determines the tool-path, which not only enables personalization of the produced artifacts, but also can overcome complicated challenges, such as merging a number of 3D elements into a single hybrid object.

The handheld machining tool provides the user with direct and immediate control over the tool-path for machining (subject, if the protective feature is not overridden, to not entering the protected region defined by the CAD model). The surface smoothness and resolution of a machining task are determined by the size and shape of the bit and the tool-path. Usually, a manual fabrication process renders a chaotic surface pattern compared to that of an automatic process, which renders an organized network of tool marks (assuming the same cutting bit). Unlike the mechanical tool-path, the manual one, which is a product of the maker's dexterity and patience, never repeats itself, evolving into a singular surface texture.

Figure 6B:
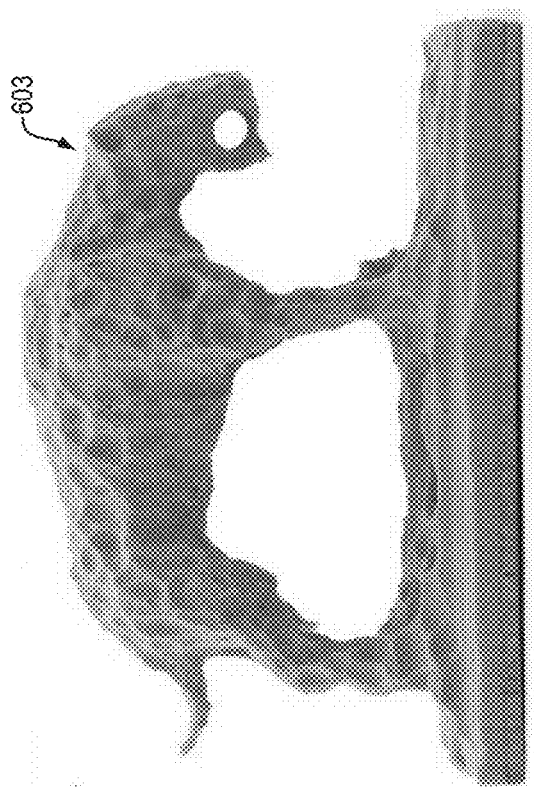
FIG. 6B is a photograph of a sculpture of the tiger, which was fabricated using a prototype of the handheld machining tool.
Figure 6A:
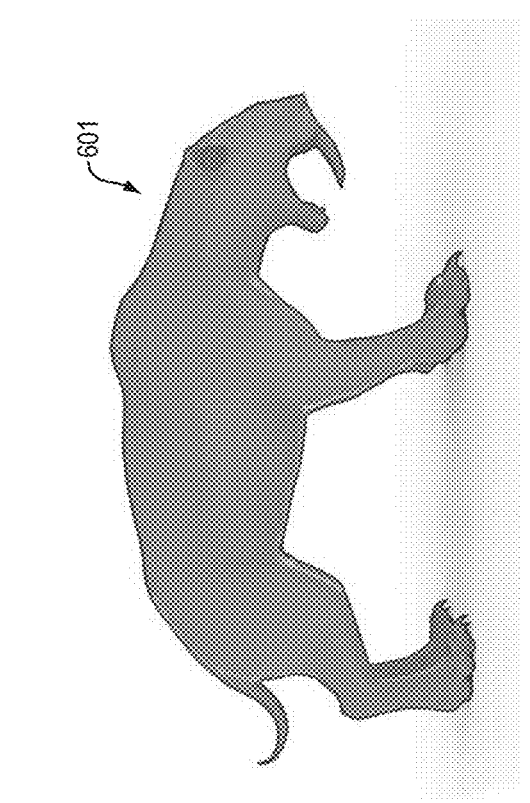
FIG. 6A is a visualization of a CAD model of a tiger.

FIGS. 6A and 6B show an example of static mode operation. FIG. 6A is a visualization 601 of a static CAD model of a tiger. FIG. 6B is a photograph of a sculpture 603 of the tiger, which was fabricated using a prototype of the handheld tool and this static model. The final texture is a product of the user tool-path, the properties of the material, the bit size, and the latency of the system. In addition to texture qualities, several parts were left unfinished (the legs), as a demonstration of decisions made during the work. The tool is capable of achieving a smoother surface than shown in FIG. 6B, as a factor of the user's patience and finishing time.

During static mode operation, the user can switch between different CAD models during the work, by changing the reference model in the computer and positioning it virtually. The fusion of these models need not be determined numerically as the user inherently resolves these challenges physically while fabricating, relinquishing the need to solve mesh intersection problems and updating a single CAD model to represent the output.

Figure 7:
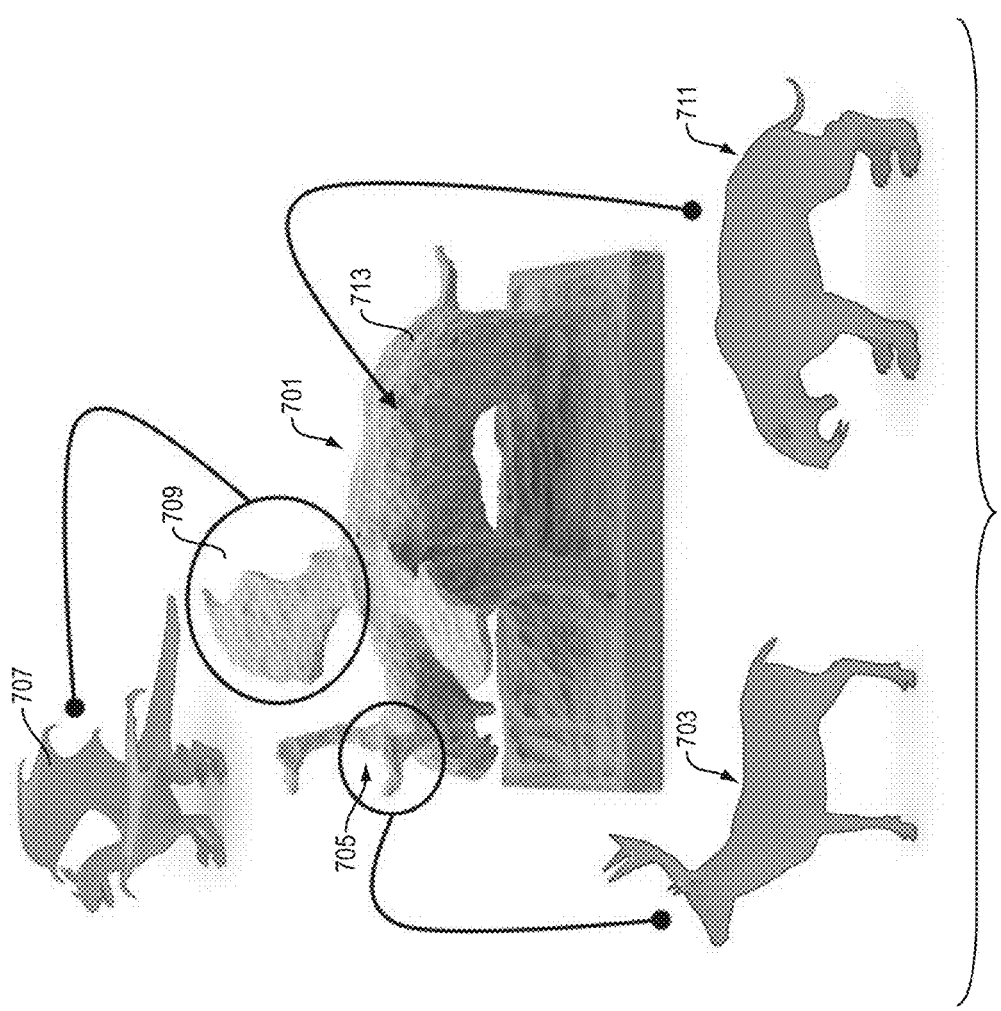
FIG. 7 shows a fabricated object with a hybrid 3D shape that matches parts of three different meshes. The hybrid 3D shape does not exist virtually; it exists only in the fabricated object.

For example, FIG. 7 shows a hybrid sculpture 701 that merges a saber-tooth tiger model 713 with dragon wings 709 and deer horns 705, where the parts were virtually aligned and switched among themselves during the working process, without having a representative watertight mesh. As shown in FIG. 7, the sculpture has a hybrid 3D shape that matches parts of three different meshes (saber tooth tiger 713, deer 703 and dragon 707). The hybrid 3D shape does not exist virtually; it exists only in the fabricated object.

During static mode operation, the user may intentionally override the CAD model, and intentionally remove material from the volume that would otherwise be protected by the static model. By overwriting the computer with the override button on the handle, the user can minimize the digital control of the spindle. The user still receives feedback regarding the bit's position with respect to the model (with a sonic alarm and LED). Thus, when the static CAD model is being overridden, it functions effectively as a non-binding recommendation. In addition to leaving parts unfinished (as in the earlier example), a user who has overrode the protective function can intentionally "damage" the static model, working around or inside the virtual shape. This mode allows for physical improvisation, without updating the CAD model.

FIG. 8 is a photograph of a sculpture 801, produced by a human user overriding a static CAD model of a tiger. The result of overriding the computer guidance is a completely different model. The artists took risks and produced a unique artifact. In the example shown in FIG. 8, the user continued to manually remove parts of the model (e.g., at 803) to achieve a unique artifact, representing real-time manual interpretations of the CAD model.

Dynamic Mode:

In the dynamic mode, the user can work with a CAD model that dynamically changes in response to user actions during the course of fabrication. The dynamic mode allows a user of the handheld tool to work creatively within a controlled environment, where a dynamically responsive model guides the sculpting.

The dynamic mode has at least three submodes: (1) direct shape deformation, (2) volume occupancy optimization, and (3) data-driven shape exploration. Each submode is a different way in which a user can interact with a dynamic CAD model.

A. Direct Shape Deformation (Dynamic Mode)

One type of user interaction in dynamic mode is direct shape deformation. In this submode, the user can deform the shape of the CAD model by movements of the handheld machining tool (and other actions) taken during the sculpting. In this submode (direct shape deformation), when the user presses the override button and moves the bit inside the CAD model, the computer deforms the mesh at the risk zone to ameliorate the penetration and loss of material.

In a prototype of this invention, a simple weighted approach is used for local deformation with respect to the user's action. As weights for the offset vector of vertices ($\vec{O}_v$, where v is the vertex index), a Gaussian decay over the geodesic distance from the nearest point to the bit is employed, in order to create an effect of a smooth deformation:

$$\vec{O}_v = \vec{T}_v * e^{\frac{-(d_v/S)^2}{0.005(10-Pr)^2}} \quad \text{(Eq. 3)}$$

where $\vec{PrT}$ is the penetration vector (the vector between the point of first contact to the deepest bit position), $d_v$ is the distance from v to the penetration point, and S is the amount of affected vertices, which can be defined by the user (and thus define the affected area).

Figure 9C:
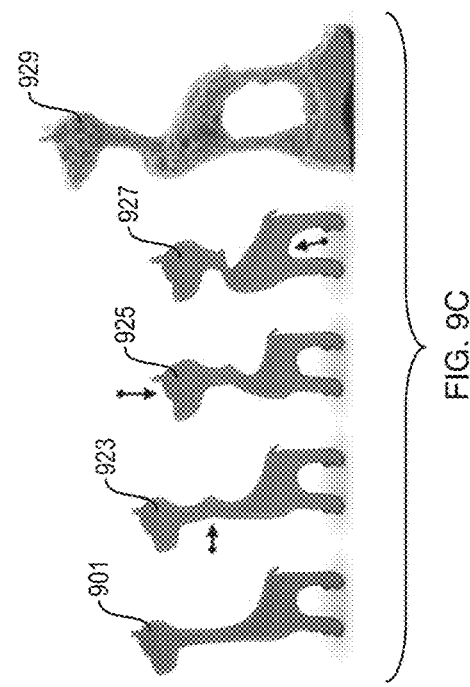
FIGS. 9A, 9B, 9C illustrate model deformation when the human user of the handheld machining tool overrides an original CAD model.
Figure 9B:
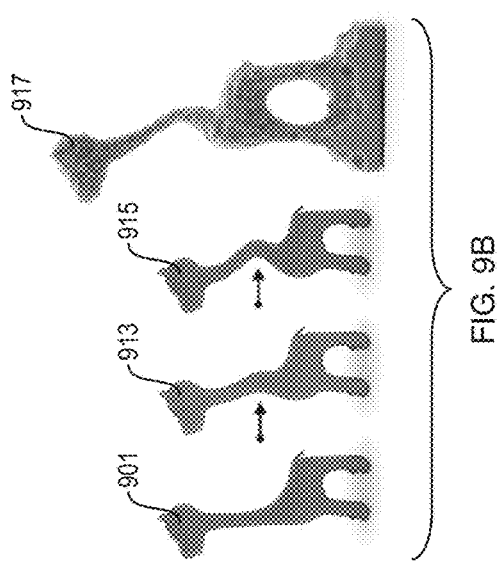
Figure 9A:
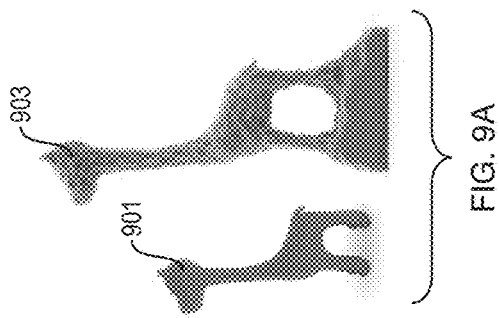

FIGS. 9A, 9B, 9C illustrate direct model deformation. In direct model deformation, the user can override and deform the CAD model. The user moves the bit of the handheld machining tool to within the volume of the model. In response, the computer smoothly deforms the CAD model in proportion to the bit's penetration of the material.

FIG. 9A shows a sculpture 903 of a giraffe produced in accordance with the original CAD model 901, without a user override. In other words, the user did not choose to deform the model.

FIGS. 9B and 9C show sculptures 917, 929 of a giraffe, which were produced using a CAD model that dynamically deformed in response to the user's carving actions. In FIG. 9B, the neck of the original CAD model 901 became progressively more bent 913, 915 as the bit approached from the left. In FIG. 9B, the neck of the original CAD model 901 became progressively more bent 923, 925, 927 as the bit approached from the left and then from the top.

B. Volume Occupancy Optimization (Dynamic Mode)

A second type of user interaction in dynamic mode is Volume Occupancy Optimization (VOO). In VOO, the computer calculates a CAD model that best fits the shape of the object sculpted, for example, an irregular piece of wood. The artist may select the VOO option to try to maximize the volume of the contained shape as a creative decision, and to minimize the amount of material to remove. The computer-assisted handheld machining tool allows a user to work in this fashion.

In VOO, the computer can dynamically modify the CAD model in response to the user's carving actions. As the user changes the shape of the physical object by removing material, the computer responds by determining a new CAD model that maximizes the volume occupancy of the new physical shape.

In a prototype of this invention, VOO is implemented by the computer using numerical optimization of volume occupancy for a parametric model of three parameters.

To illustrate volume occupancy optimization (VOO) according to principles of this invention, consider the following example: a bowl, which is a simple parametric object. A plain bowl has three parameters: outer radius ($r_o$), inner radius ($r_i$) and height (c). Denote $\Theta=\{r_o,r_i,c\}$.

In this example, parameteric spheres and cubes can be used to create the model of the bowl with constructive solid geometry (CSG) boolean operations (implemented by the Carve CSG library).

In order to fit the bowl shape in the material, the remaining volume is determined. To do so, as the handheld machining tool carves (without restriction) a part of a rectangular piece of material, position data is gathered by the MMTS and used to calculate the toolpath. The computer calculates the remaining volume of the material by applying thresholds on the x, y and z positions of the bit to determine what was removed.

Insofar as each discrete point along the toolpath describes only the center of the bit, rather than the complete volume the bit had removed, multiple points (e.g., 10 points) are sampled on a sphere with radius equal to the actual bit size (e.g., 3.2 mm) to represent the entire volume of the bit as it passed through space. This point-cloud describes the volume where the bit removed material.

In this example, a solid shape is created out of the tool-path point cloud using the Alpha Shapes method. Once the removed portion is computed, the remaining volume is easily determined.

In this example, given the remaining volume, the computer calculates a parametric bowl that maximizes a multivariate score function is fitted inside. The score function is as follows:

$$f_1(\Theta)=w_1*V_{remain}(\Theta)$$

$$f_2(\Theta)=w_2*V_{out}(\Theta)$$

$$f_3(\Theta)=w_3*(1-c)$$

$$f_4(\Theta)=w_4*(1-r_{in})$$

$$F(\Theta)=[f_1(\Theta);f_2(\Theta);f_3(\Theta);f_4(\Theta)] \quad \text{(Eq. 4)}$$

The score function returns a vector. The computer minimizes the norm of the vector. The $V_{remain}(\Theta)$ marks the remaining volume and $V_{out}(\Theta)$ marks the volume that the shape takes outside the remaining volume, i.e. out in the air. Both these measures are minimized in order to maximize occupancy and minimize escape. The bowl is also made to be as high and thick as possible, which is embodied in the final two residuals.

In this example, a non-linear least-squares solver is used to find the solution for the following optimization problem:

$$\arg\min_\Theta \|F(\Theta)F\|^2 \quad \text{(Eq. 5)}$$

In this example, because of the CSG operations, the function is evaluated numerically. To bootstrap the parametric search a grid search of the space is first used to find a starting point; the solver then finds the optimal solution and thus the best fitting bowl to the given volume.

C. Data-Driven Shape Exploration (Dynamic Mode)

A third type of user interaction in dynamic mode is Data-Driven Shape Exploration (DDSE). In DDSE, the computer-assisted handheld machining tool uses a database of shapes to dynamically modify the CAD model, in response to carving motions made by the user.

For example, consider a humanoid model, which is a canonical pursuit in sculpting and drawing.

In order to construct the database, in a prototype of this invention, over 4000 examples of human pose are recorded with the Kinect sensor via the OpenNI software stack. The poses are clustered using a K-Means variant, to 50 clusters (meta-poses) of varying sizes, using WEKA (Waikato Environment for Knowledge Analysis). Then the humanoid model is auto rigged to a skeleton model that corresponds with the Kinect. For deformation of the mesh the Linear Blend Skinning method was used.

The process of finding the remaining volume, employed in VOO, is used here. Then, a search over the clustered database is performed to find the pose that has the least amount of escape from the remaining volume ($V_{out}$), followed by a search within the best found cluster. In each iteration, the user chooses from multiple options for advancement. After the database search is concluded, fine tuning ensues, for the position of the limbs (arms and legs) and for small translations (on the ground plane) of the entire shape in respect to the volume. A grid-search of the parametric space is performed to find the best tuning of the selected pose.

Autonomous Operation Mode:

In exemplary implementations of this invention, independent actuation of the shaft operates semi-autonomously: while the user holds the handheld machining tool and makes large-scale movements, the tool makes autonomous smaller-scale movements. Thus, the tool can be operated as a semi-autonomous machining tool at small scale.

Figure 10:
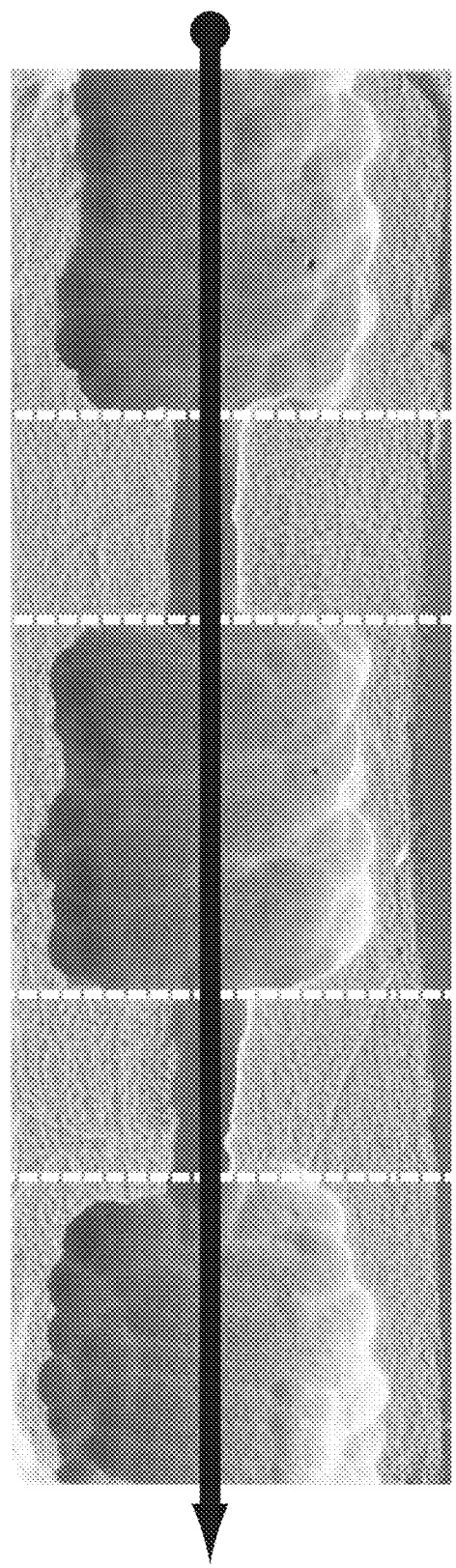
FIG. 10 is a photograph showing, among other things, regions machined using autonomous operation of a handheld machining tool.

FIG. 10 is a photograph showing regions milled as the bit moves in a straight line through material. In some regions, the semi-autonomous mode was not used, creating a narrow cut. In other regions, the tool operated semi-autonomously to remove more material, resulting in a larger virtual bit.

The semi-autonomous mode can be used for texture rendering. For example, this mode can be used to render a fur texture. When the bit is closer than 4 mm to the fur segment, the servos operate with a linear pecking movement (4 Hz, 5 mm movement range) to achieve a fur texture on the teddy bear surface. The user continues to operate the tool freely, not constrained by the shaft actuation.

Surface textures can be created using autonomous mode operation. For example, a CAD model of a teddy bear can be embellished with fur textures. The mesh surface can be encoded with either a rough texture or smooth texture. Rough texture causes the shaft to move back and forth, creating dimples in the material that simulate fur.

A user may input selections to change the interaction mode (e.g., static, dynamic DSD, dynamic VOO, dynamic DDSE, or autonomous).

Examples of Use of Prototype

Here are some non-limiting examples of use of a prototype of this invention. The prototype was used to fabricate multiple complete artifacts. The tool carved both high and low density balsa foams, basswood, and carving wax. The control software updated at a frame rate varying between 10 to 20 frames per second (FPS). The computer worked with mesh models of 150 vertices (humanoid) to 5370 vertices (gargoyle), lengths between 120 mm (giraffe) to 280 mm (gargoyle), and with production times of 40 minutes (giraffe) to 5 hours (gargoyle). The system static-bit accuracy (measured by holding the bit in one place while rotating the tool around it) varied between 0.05 mm RMS (20 cm from the magnetic field generator) to 0.4 mm RMS (70 cm away).

The surface accuracy of the tool (i.e., how accurately the tool can reconstruct a predesigned CAD model) depends on, among other things, the frame rate, tool movement speed, and material density. For example, in one case, with 15 FPS and 350 mm/sec attack speed, the bit penetrated 3.5 mm in a dense balsa foam before the system shut down the spindle rotation. However, adherence of the resulting surface to the CAD model also depends on the maker's dexterity and patience when working with the tool.

In illustrative uses of the prototype, the user often started by cutting material farther from the objects, usually by guiding the tool along horizontal and vertical lines, removing material from one side to another. Once the model became recognizable to the human, the operation often changed to tracking the surface manifolds with the tool. These machining methods were typically intuitively decided by the user during the work, rather than being planned in advance. At times when there was a risk to harm the model the tool prevented a mistake by stopping the spindle, applying an invisible "protection field" around the object. The changes in the spindle speed, when the bit approaches the model surface, informed the user regarding the relative location of the bit with respect to the model. This feedback helped the user identify the invisible "protection field" the system creates around the shape inside the material.

In illustrative uses of the prototype, the display screen presents a visualization of the CAD model. In this visualization, a mark displayed on the screen represents the current position of the tool's bit. Occasionally, the user relied on this mark during the work, especially in the initial stage where the virtual shape is not yet revealed in the raw material.

This invention may be implemented with a projector for projecting visual feedback of the CAD model on the material being sculpted.

Definitions and Clarifications

Here are a few definitions and clarifications. As used herein:

The terms "a" and "an", when modifying a noun, do not imply that only one of the noun exists.

The term "bit" shall be construed broadly. The term "bit" includes (i) any milling cutter and (ii) any other tool configured to remove material from an object by shear deformation or abrasion while in physical contact with the material. A "bit" may, for example, operate by either linear or rotary motion.

The term "CAD model" shall be construed broadly. For example, the term "CAD model" includes any model that (i) was created or modified, at least in part, by a computer and (ii) is stored in electronic memory. A CAD model may be of any object. For purposes of this definition of CAD model: (i) the term "model" shall be construed broadly and shall include any model, design, mesh or representation, and shall further include any set of data representing points in a 3D volume or positions in or elements of a 3D object, including the surface or interior of a 3D object, and (ii) the term "object" shall be construed broadly to include any shape, object or structure. A CAD model does not necessarily control the shape of an object produced by using the CAD model. For example, in some cases, a CAD model may function effectively as a non-binding recommendation or suggestion.

The term "carve" (and similar terms, such as "carving") shall be construed broadly. For example, carving includes any method of removing material from an object.

The term "cutting speed" shall be construed broadly. The term "cutting speed" may apply to either a rotary or linear cutting tool. In each case, the "cutting speed" is the speed difference between the cutting tool and the workpiece. For example, in the context of a rotary cutting tool, "cutting speed" is the linear tangential equivalent (at the tool/workpiece interface) of the spindle speed. The term "cutting speed" does not include feed speed.

The term "comprise" (and grammatical variations thereof) shall be construed broadly, as if followed by "without limitation". If A comprises B, then A includes B and may include other things.

The term "e.g." means for example.

The fact that an "example" or multiple examples of something are given does not imply that they are the only instances of that thing. An example (or a group of examples) is merely a non-exhaustive and non-limiting illustration.

Unless the context clearly indicates otherwise: (1) a phrase that includes "a first" thing and "a second" thing does not imply an order of the two things (or that there are only two of the things); and (2) such a phrase is simply a way of identifying the two things, respectively, so that they each can be referred to later with specificity (e.g., by referring to "the first" thing and "the second" thing later). For example, unless the context clearly indicates otherwise, if an equation has a first term and a second term, then the equation may (or may not) have more than two terms, and the first term may occur before or after the second term in the equation. A phrase that includes "a third" thing, a "fourth" thing and so on shall be construed in like manner.

The terms "horizontal" and "vertical" shall be construed broadly. For example, "horizontal" and "vertical" may refer to two arbitrarily chosen coordinate axes in a Euclidian two dimensional space.

The term "include" (and grammatical variations thereof) shall be construed broadly, as if followed by "without limitation".

The term "or" is inclusive, not exclusive. For example "A or B" is true if A is true, or B is true, or both A or B are true. Also, for example, a calculation of "A or B" means a calculation of A, or a calculation of B, or a calculation of A and B.

A parenthesis is simply to make text easier to read, by indicating a grouping of words. A parenthesis does not mean that the parenthetical material is optional or can be ignored.

The term "machining" shall be construed broadly. For example, machining includes (i) any removal of material by shear deformation or abrasion, (ii) any removal of matter from a first object caused by mechanical movement of one or more other objects relative to the first object, or (iii) any other removal of material from a solid object. "Machining"

includes, for example, cutting, carving, milling, lathing, drilling, boring, broaching, sawing, shaping, planing, turning, reaming, tapping, grinding, and abrading. Machining may occur, for example, by either rotary motion or linear motion of a part relative to the object being machined. "Machining" also includes all other methods of subtractive fabrication, including electrical discharge machining, electrochemical machining, electrochemical machining, electron beam machining, photochemical machining, ultrasonic machining, laser ablation, and laser cutting. A "machining tool" includes, for example (i) any tool that cuts material with a rotary bit, (ii) any milling tool, or (iii) any tool that removes material from another solid object. Also, for example, a "machining tool" includes any mill, lathe, drill, saw, blade, scraper, awl, broach, laser cutter, or any tool with a single cutting point or multiple cutting points, including at any scale. Also, for example, a "machining tool" includes any tool configured for machining. A slowing or halt of machining may comprise, for example, a reduction or halt of cutting speed, in the case of a machining tool that operates by a linear or rotary cutting motion. The term "machining" does not imply that the removal of material is controlled by a machine or by a static design.

The term "sculpture" (and similar terms, such as "sculpt") shall be construed broadly. For example, sculpting includes any method of removing material from an object.

The term "tool" shall be construed broadly. The term "tool" includes (i) any physical item that can be used to achieve a goal, and (ii) any instrument, utensil, implement, machine, apparatus or equipment.

Variations:

This invention may be implemented in many different ways, and is not limited to the embodiments described above. Here are some non-limiting examples.

This invention may, for example, comprise (i) a milling tool, (ii) a linear or rotary cutting tool, or (iii) a machining tool.

This invention may, for example, be implemented using any computer assisted handheld apparatus configured for subtractive fabrication or additive fabrication.

This invention may be implemented as apparatus comprising a machining tool, wherein the machining tool: (a) is configured to be handheld by a human user while effecting removal of material from an object; (b) includes a bit; (c) is configured to be able to perform a function, the function comprising slowing or halting the removal of material depending on position of the bit relative to a physical region defined by a CAD model; (d) is configured to enable or disable the function, in response to input from the user, and (e) is configured to accept in real time or to compute in real time modifications to the CAD model, which modifications to the CAD model are determined, at least in part, by at least some movements of the bit relative to the object during the machining. Furthermore: (1) the modifications to the CAD model may comprise deformation of a surface of the CAD model, which deformation minimizes either (i) penetration of the bit into the physical region defined by the CAD model, (ii) amount of material removed from the physical region defined by the CAD model, or (iii) another value that depends at least in part on the penetration or the amount of material removed; (2) the modifications may alter the CAD model to maximize percentage, by volume, of the object that is occupied by the physical region defined by the CAD model; (3) the modifications may be computed, at least in part, by selecting, out of a set of multiple CAD models, a selected CAD model that maximizes percentage, by volume, of the object that is occupied by the physical region defined by the selected CAD model; (4) the apparatus may be further configured to actuate the bit to move in paths relative to the object that are not determined by the user; (5) the apparatus may include at least one sensor for detecting data indicative of position of the machining tool relative to the object, (6) the apparatus may include at least one sensor for detecting data indicative of pressure exerted by the machining tool on the object; (7) the apparatus may include one or more transducers for providing feedback to the user regarding at least one of a group consisting of: (i) position of the machining tool relative to the object, or (ii) pressure exerted by the machining tool on the object; (8) the modifications to the CAD model may be computed, at least in part, by one or more computers that are external to the machining tool; (9) the apparatus may further comprise the one or more computers; (10) different CAD models may be used for different portions of the object, in accordance with selections inputted by the user; and (11) the function may protect a hybrid physical region, which region does not correspond to any single CAD model.

This invention may be implemented as a method comprising using a machining tool, wherein the machining tool: (a) is configured to be handheld by a human user while effecting removal of material from an object; (b) includes a bit; (c) is configured to be able to perform a function, the function comprising slowing or halting the removal of material depending on position of the bit relative to a physical region defined by a CAD model; (d) is configured to enable or disable the function, in response to input from the user, and (e) is configured to accept in real time or to compute in real time modifications to the CAD model, which modifications to the CAD model are determined, at least in part, by at least some movements of the bit relative to the object during the machining. Furthermore: (1), the modifications to the CAD model may comprise deformation of a surface of the CAD model, which deformation minimizes either (i) penetration of the bit into the physical region defined by the CAD model, (ii) amount of material removed from the physical region defined by the CAD model, or (iii) another value that depends at least in part on the penetration or the amount of material removed; (2) the modifications may alter the CAD model to maximize percentage, by volume, of the object that is occupied by the physical region defined by the CAD model; (3) the modifications may be computed, at least in part, by selecting, out of a set of multiple CAD models, a selected CAD model that maximizes percentage, by volume, of the object that is occupied by the physical region defined by the selected CAD model; (4) the apparatus may be further configured to actuate the bit to move in paths relative to the object that are not determined by the user; and (5) different CAD models may be used for different portions of the object, in accordance with selections inputted by the user.

This invention may be implemented as apparatus comprising a machining tool, wherein the machining tool: (a) is configured to effect removal of material from an object, the removal of material having an operative rate and occurring within an operative zone; (b) is configured to be handheld by a human user during the removal of material; (c) is configured to be able to perform a function, the function comprising slowing or halting the operative rate depending on position of the operative zone relative to a physical region defined by a CAD model; (d) is configured to enable or disable the function, in response to input from the user, and (e) is configured to accept in real time or to compute in real time modifications to the CAD model, which modifications to the CAD model are determined, at least in part, by at least some movements of the operative zone relative to the object during the removal of material.

This invention may be implemented as apparatus comprising a tool for subtractive fabrication or additive fabrication, wherein the tool: (a) is configured to effect removal of material from or deposition of material to an object; which removal or deposition has an operative rate and occurs within an operative zone; (b) is configured to be handheld by a human user during the removal or deposition; (c) is configured to be able to perform a function, the function comprising altering the operative rate depending on position of the operative zone relative to a physical region defined by a CAD model; (d) is configured to enable or disable the function, in response to input from the user, and (e) is configured to accept in real time or to compute in real time modifications to the CAD model, which modifications to the CAD model are determined, at least in part, by at least some movements of the operative zone relative to the object during the removal or deposition of material.

CONCLUSION

It is to be understood that the methods and apparatus that are described herein are merely illustrative applications of the principles of the invention. Numerous modifications may be made by those skilled in the art without departing from the scope of the invention.

What is claimed is:

1. Apparatus comprising a machining tool and a tracking system, wherein:
   (a) the tracking system is configured to track position of a bit of the machining tool relative to an object; and
   (b) the machining tool:
      (i) includes a shaft that is attached to the bit;
      (ii) is configured to be held by a human user while effecting physical removal of material from the object, such that the weight of the tool is supported solely by a hand of the user during the removal,
      (iii) is configured to be controlled depending on the tracked position of the bit relative to the object, to prevent the bit from entering a protected region, by causing the shaft to undergo retraction, such that during the retraction the shaft moves relative to a handle of the machining tool; and
      (iv) is configured to calculate, in response to a movement of the bit relative to the object during the physical removal of material, a change in the boundary of the protected region;
   wherein the protected region is defined by a computer-aided design (CAD) model.

2. The apparatus of claim 1, wherein the bit moves away from the protected region during the retraction.

3. The apparatus of claim 2, wherein the machining tool is configured such that, after the retraction, the shaft is returned to an original position.

4. The apparatus of claim 1, wherein the shaft is moveable, in multiple degrees of freedom, relative to a handle of the apparatus.

5. The apparatus of claim 4, wherein the shaft is moveable laterally, relative to the handle.

6. The apparatus of claim 1, wherein the apparatus includes multiple-axis bearings configured such that the shaft is moveable, in multiple degrees of freedom, relative to a handle of the apparatus.

7. The apparatus of claim 1, wherein the apparatus includes a button for accepting input that comprises an instruction that overrides computer control that would otherwise prevent the bit from entering the protected region.

8. The apparatus of claim 1, wherein:
   (a) the apparatus includes a pressure sensor for measuring pressure;
   (b) the bit is a rotary bit and the machining tool includes a motor for powering the rotary bit; and
   (c) the motor is configured to have a motor speed that is a linear factor of parameters that include the pressure.

9. The apparatus of claim 1, wherein the change in a boundary of the protected region minimizes the volume of material that needs to be removed from the object to achieve a target shape.

10. The apparatus of claim 1, wherein the change in the boundary of the protected region is computed by selecting, out of a set of virtual models of protected regions, a model that minimizes the volume of material that needs to be removed from the object to achieve a target shape.

11. A method comprising:
    (a) a tracking system tracking position of a bit of a machining tool relative to an object;
    (b) a machining tool physically removing material from an object;
    (c) controlling the machining tool, depending on the tracked position of the bit relative to the object, to prevent the bit from entering a protected region, by retracting a shaft that is attached to the bit, such that during the retracting the shaft moves relative to a handle of the machining tool; and
    (d) calculating, in response to a movement of the bit relative to the object during the physical removal of material, a change in the boundary of the protected region;
    wherein
      (i) the tool is configured to be supported solely by a hand of a user during the removal of material, and
      (ii) the protected region is defined by a computer-aided design (CAD) model.

12. The method of claim 11, wherein, the bit moves away from the protected region during the retracting.

13. The method of claim 12, wherein the machining tool is configured such that, after the retracting, the shaft is returned to an original position.

14. The method of claim 11, wherein the shaft is moveable, in multiple degrees of freedom, relative to a handle of the apparatus.

15. The method of claim 11, wherein the shaft is moveable laterally, relative to the handle.

16. The method of claim 11, wherein the machining tool includes multiple-axis bearings configured such that the shaft is moveable, in multiple degrees of freedom, relative to a handle of the apparatus.

17. The method of claim 11, wherein the machining tool includes a button that accepts input, which input overrides computer control that would otherwise prevent the bit from entering the protected region.

18. The method of claim 11, wherein:
    (a) a pressure sensor in the machining tool measures pressure;
    (b) the bit is a rotary bit;
    (c) a motor in the machining tool powers the rotary bit; and
    (c) the motor has a motor speed that is a linear factor of parameters that include the pressure.

19. The method of claim 11, wherein the change in a boundary of the protected region minimizes the volume of material that needs to be removed from the object to achieve a target shape.

20. The method of claim 11, wherein the change in the boundary of the protected region is computed by selecting, out of a set of virtual models of protected regions, a model that minimizes the volume of material that needs to be removed from the object to achieve a target shape.

* * * * *